United States Patent
Anderson et al.

(10) Patent No.: US 9,348,948 B2
(45) Date of Patent: May 24, 2016

(54) METHOD OF PART VERIFICATION

(71) Applicant: Spirit AeroSystems, Inc., Wichita, KS (US)

(72) Inventors: David Scott Anderson, Derby, KS (US); Clark Ray Miller, Wichita, KS (US); Ryan Plourde, Wichita, KS (US)

(73) Assignee: Spirit AeroSystems, Inc., Wichita, KS (US)

( * ) Notice: Subject to any disclaimer, the term of this patent is extended or adjusted under 35 U.S.C. 154(b) by 527 days.

(21) Appl. No.: 13/829,414

(22) Filed: Mar. 14, 2013

(65) Prior Publication Data

US 2014/0278265 A1  Sep. 18, 2014

(51) Int. Cl.
| | |
|---|---|
| *G06F 17/50* | (2006.01) |
| *G06T 19/20* | (2011.01) |
| *G01B 5/004* | (2006.01) |
| *G01B 5/008* | (2006.01) |

(52) U.S. Cl.
CPC ............ *G06F 17/50* (2013.01); *G06T 19/20* (2013.01); *G06T 2219/2021* (2013.01)

(58) Field of Classification Search
CPC ...... G01B 5/008; G01B 21/045; G01B 21/04; G01B 21/047; G01B 5/00; G06F 17/5009; G06F 17/50; G06F 17/5018
USPC .................................................. 703/7; 33/503
See application file for complete search history.

(56) References Cited

U.S. PATENT DOCUMENTS

| | | | | |
|---|---|---|---|---|
| 4,918,627 A | * | 4/1990 | Garcia ................... | G06T 7/001 348/92 |
| 2003/0149498 A1 | * | 8/2003 | Rebello .............. | G05B 19/4097 700/97 |
| 2005/0121422 A1 | * | 6/2005 | Morden .................. | B25H 7/00 219/121.6 |
| 2012/0233869 A1 | * | 9/2012 | Dowidar ............... | G01B 5/025 33/503 |

OTHER PUBLICATIONS

Soo et al. "Three dimensional finite element modeliing of high-speed milling of Inconel 718", Proceedings of the Institute of Mechanical Engineers, Part B: Journal of Engineering Manufacture, Nov. 1, 2004, vol. 218, p. 1555-1561.*

* cited by examiner

*Primary Examiner* — Thai Phan
*Assistant Examiner* — Shiuh-Huei Ku
(74) *Attorney, Agent, or Firm* — Hovey Williams LLP

(57) ABSTRACT

An automated method of verifying a part includes scanning the part to create a three-dimensional computer-based model of the part, indexing the computer-based model of the part to a three-dimensional nominal part design, and adjusting the shape of the model to generate an adjusted model with a shape corresponding to the shape of the nominal part design. The adjusted model is compared to the nominal part design to identify variations between the size and configuration of the adjusted model and the target part design are determined. Furthermore, it is determined whether adjusting the part to conform to the nominal part design would compromise the structure of the part.

18 Claims, 5 Drawing Sheets

METHOD OF PART VERIFICATION

FIELD

Embodiments of the present invention relate to automated part verification.

BACKGROUND

In some industries, such as the aircraft industry, manufactured parts must be inspected to ensure that the size and the shape of each part, as well as the placement of various part features such as apertures, corners and trim, conform to the nominal or engineered design. Parts may experience a small amount of warping or other changes in shape during or after the manufacturing process. Such changes in the shapes of parts may, not render the parts defective or unusable, but can complicate the inspection process by introducing variances between certain dimensions of the manufactured part and the engineered part design.

One way to accommodate such changes in the shape of the part during inspection is to place the part in a fixture that constrains the part to the shape of the engineered design. Unfortunately the use of fixtures can be impractical due to cost. Typically, a unique fixture must be created for each manufactured part, and each fixture may cost as much as $100,000 or more. Furthermore, the process of placing parts in fixtures is labor-intensive and is subject to certain inaccuracies, including mechanical tolerances of the fixture. These mechanical tolerances may be impacted by wear and tear due to repeated use of the fixture and may also be negatively affected by thermal expansion and contraction. If the fixture has a different coefficient of thermal expansion than the part, for example, changes in temperature may cause the fixture to expand or contract a different amount than the part, causing a good part to fail inspection or, worse yet, causing a defective part to pass inspection.

To avoid the costs associated with the use of fixtures for part verification, some manufacturers use a manual process of part verification that does not involve fixtures. Rather, human operators measure the part in a relaxed or free state. These processes are also labor-intensive and subject to human error as well as errors inherent in the inspection of deformed parts. A minor but undetected deformation, for example, may cause the radius of curvature of a part to be larger or smaller than the nominal radius of curvature, which may cause the operator to determine that one or more features, such as holes or trim, are misplaced.

The above section provides background information related to the present disclosure and is not necessarily prior art.

SUMMARY

Embodiments of the present invention solve the above-described problems by providing improved systems and methods for verifying a manufactured part that involve measuring a part in a relaxed or free state and using a computer program to verify the size, shape and structural integrity of the part.

A method of verifying a part in accordance with an embodiment of the present invention comprises scanning the part to create a three-dimensional computer-based model of the part, indexing the computer-based model of the part to a three-dimensional nominal part design, and adjusting the shape of the model to generate an adjusted model with a shape corresponding to the shape of the nominal part design. Variations between the size and configuration of the adjusted model and the nominal part design are then determined, and information collected while adjusting the shape of the model is used to determine whether adjusting the part to conform to the nominal part design would compromise the structure of the part.

A method of verifying a part in accordance with another embodiment of the present invention comprises scanning the part in an unrestrained position to create a point cloud comprising a plurality of points each representing a point on the surface of the part, indexing the point cloud to a mesh based on a nominal part design, and adjusting the shape of the point cloud to generate an adjusted point cloud with a shape corresponding to the shape of the mesh. The step of adjusting the point cloud includes (a) selecting a plurality of different load points on the point cloud, (b) determining a gap between the point cloud and the mesh at each of the load points, (c) identifying the largest gap, (d) adjusting the shape of the point cloud to simulate applying a load to the point cloud at the load point corresponding to the largest gap, the magnitude of the simulated load being sufficient to reduce the largest gap to within a tolerance, and (e) repeating steps (b) through (d) until all of the gaps are within the tolerance. Variances between the size and configuration of the adjusted point cloud and the mesh are determined, and information collected while adjusting the shape of the point cloud is used to determine whether adjusting the part to conform to the mesh would compromise the structure of the part.

A method of verifying a part in accordance with yet another embodiment of the present invention comprises scanning the part to create a three-dimensional computer-based model of the part, indexing the computer-based model of the part to a three-dimensional nominal part design, and adjusting the shape of the nominal part design to generate an adjusted design with a shape corresponding to the shape of the computer-based model. The method further comprises determining variations between the size and configuration of the adjusted design and the model, and using information collected while adjusting the shape of the design to determine whether adjusting the part to conform to the nominal part design would compromise the structure of the part.

This summary is provided to introduce a selection of concepts in a simplified form that are further described in the detailed description below. This summary is not intended to identify key features or essential features of the claimed subject matter, nor is it intended to be used to limit the scope of the claimed subject matter. Other aspects and advantages of the present invention will be apparent from the following detailed description of the embodiments and the accompanying drawing figures.

DRAWINGS

Embodiments of the present invention are described in detail below with reference to the attached drawing figures, wherein.

Figure 1:
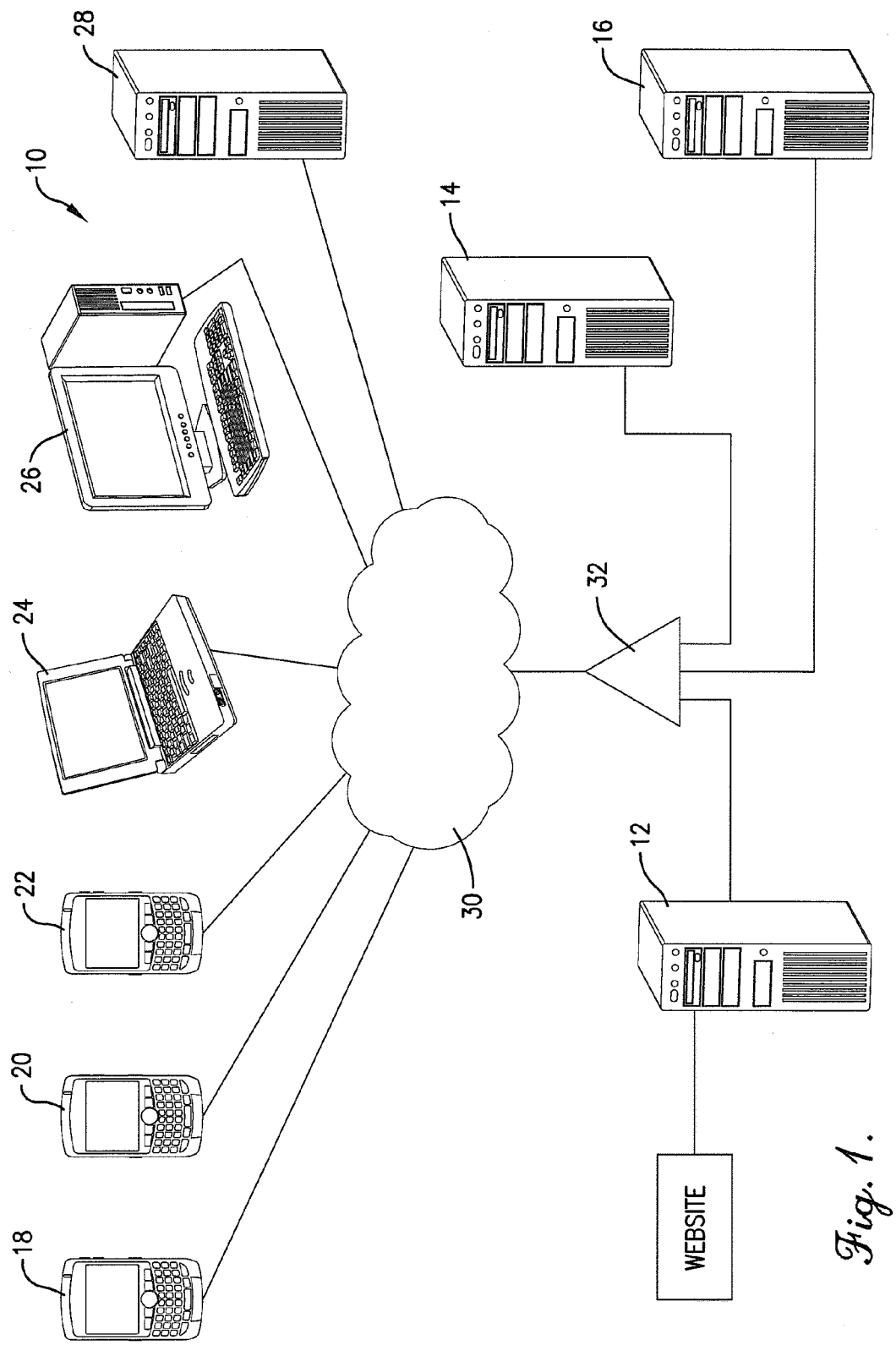
FIG. 1 is a schematic diagram of exemplary computer and communications equipment that may be used to implement certain aspects of the present invention.

The drawing figures do not limit the present invention to the specific embodiments disclosed and described herein. The drawings are not necessarily to scale, emphasis instead being placed upon clearly illustrating the principles of the invention.

DETAILED DESCRIPTION

The following detailed description of embodiments of the invention references the accompanying drawings. The embodiments are intended to describe aspects of the invention in sufficient detail to enable those skilled in the art to practice the invention. Other embodiments can be utilized and changes can be made without departing from the scope of the claims. The following detailed description is, therefore, not to be taken in a limiting sense. The scope of the present invention is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc, described in one embodiment may also be included in other embodiments, but is not necessarily included. Thus, the present technology can include a variety of combinations and/or integrations of the embodiments described herein.

Certain aspects of the present invention may be performed or enabled by computing equipment and may be implemented in hardware, software, firmware, or a combination thereof. In one exemplary embodiment, the invention is implemented with a computer program or programs that operate computer and/or communications equipment broadly referred to by the reference numeral 10 in FIG. 1. The exemplary computer and communications equipment 10 may include one or more host computers 12, 14, 16 and a plurality of electronic devices 18, 20, 22, 24, 26, 28 that may access the host computers via a communications network 30. The computer program may be configured to run on a standalone device, such as one of the computers 24, 26, 28, or may be configured to operate on a network-based computer, such as one or more of the host computers 12, 14, 16 accessible via the network 30, which may include a local area network or a wide area network such as the Internet. The computer programs and equipment illustrated and described herein are merely examples of programs and equipment that may be used to implement embodiments of the invention and may be replaced with other programs and computer equipment without departing from the scope of the invention.

If the computer program is implemented on a network accessible computer, the host computers 12, 14, 16 may serve as repositories for data and programs used to implement certain aspects of the present invention as described in more detail below. The host computers 12, 14, 16 may be any computing devices such as network or server computers and may be connected to a firewall to prevent tampering with information stored on or accessible by the computers. The functionality of the host computers may also be distributed amongst many different computers in a cloud computing environment.

The computer and communications equipment 10 may also include or use a data interchange format device 32 for distinguishing the types of devices (e.g. mobile phone, desktop computer) that attempt to access the host computers 12, 14, 16 and for routing communications and requests to the host computers accordingly.

The computer program or programs of the present invention are stored in or on computer-readable medium residing on or accessible by the computer and communications equipment 10. The computer programs preferably comprise ordered listings of executable instructions for implementing logical functions in the host computers 12, 14, 16 and/or devices 18-28. The computer programs can be embodied in any computer-readable medium for use by or in connection with an instruction execution system, apparatus, or device, such as a computer-based system, processor-containing system, or other system that can fetch the instructions from the instruction execution system, apparatus, or device, and execute the instructions. As used herein, a "computer-readable medium" can be any means that can contain, store, communicate, propagate or transport the program for use by or in connection with the instruction execution system, apparatus, or device. The computer-readable medium can be, for example, but is not limited to, an electronic, magnetic, optical, electromagnetic, infrared, or semi-conductor system, apparatus, device, or propagation medium. More specific, although not inclusive, examples of the computer-readable medium would include the following: an electrical connection having one or more wires, a portable computer diskette, a random access memory (RAM), a read-only memory (ROM), an erasable, programmable, read-only memory (EPROM or Flash memory), an optical fiber, and a portable compact disk read-only memory (CDROM).

References are made herein to the "computer program" or "program" performing certain actions with the understanding that the program provides a set of instructions that direct or enable a computer to perform the actions.

Embodiments of the present invention involve systems and methods for verifying manufactured parts in unrestrained states thereby obviating the need for part fixtures. As explained below in more detail, embodiments of the invention involve creating a three-dimensional mesh corresponding to the nominal or engineered part design, scanning the manufactured part in an unrestrained state to generate a computer-based three-dimensional model of the part, indexing or aligning the model with the mesh, adjusting the shape of the model to correspond to the mesh, and confirming that variances between the adjusted model and the mesh are within a predetermined tolerance. The process may also involve confirming that the shape part can be adjusted to conform to the shape of the mesh without comprising the structure of the part.

The mesh may be created from an engineering design file in a conventional manner using one or more computer programs. The engineering design file may be a computer-aided drafting file defining a three-dimensional part design, such as a design corresponding to the part 34 illustrated in FIG. 2. The mesh comprises a plurality of nodes in three dimensional space that constitute a digital or virtual representation of the nominal part design. Various different types of meshes may be used, but some embodiments of the invention use a tetragon mesh. The mesh includes physical properties of the material, such as stiffness and hardness, that define relationships between the nodes and enable behavioral modeling of the part design. The physical properties may be used, for example, to simulate the reaction of the part to a load by applying a simulated load to the mesh. An operator may generate several different meshes in multiple ways to generate an optimal mesh for the particular part design. Furthermore, an operator may adjust several points of the mesh to correspond to the fixture points described above.

A user identifies a plurality of fixture points on the part. The fixture points are used to align the mesh with a scanned model of a manufactured part, as explained below, and may correspond to locations of the part that may be secured by a clamp if the part were retained in a fixture. The fixture points will be perfectly constrained in the verification process in that they will not move in the processing steps described below. In some embodiments six fixture points are chosen according to a three-two-one alignment scheme wherein three of the fixture points define a plane, two of the points define a line in the plane, and the last point defines a reference point for fixing the design in space. Other alignment schemes may be used, including a point-line-point system and a line-point-line system. As explained below, the fixture points are used both to align a scanned or measured computer-based model of the part with the nominal part design, as well as to process the measured point cloud to verify the part.

Figure 2:
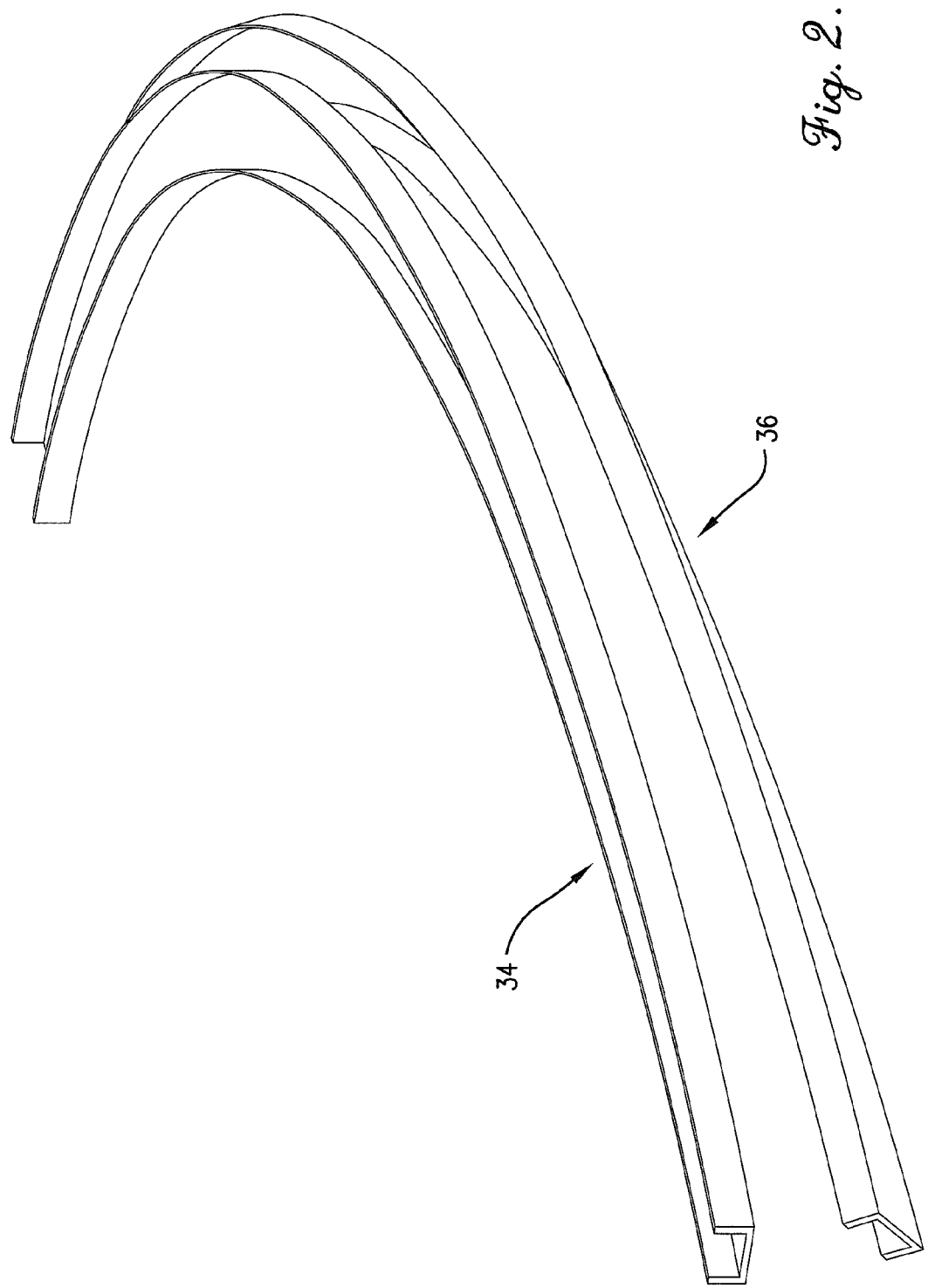
FIG. 2 illustrates the shape of a nominal part design and the shape of a manufactured part that was altered during or after the manufacturing process.
Figure 3:
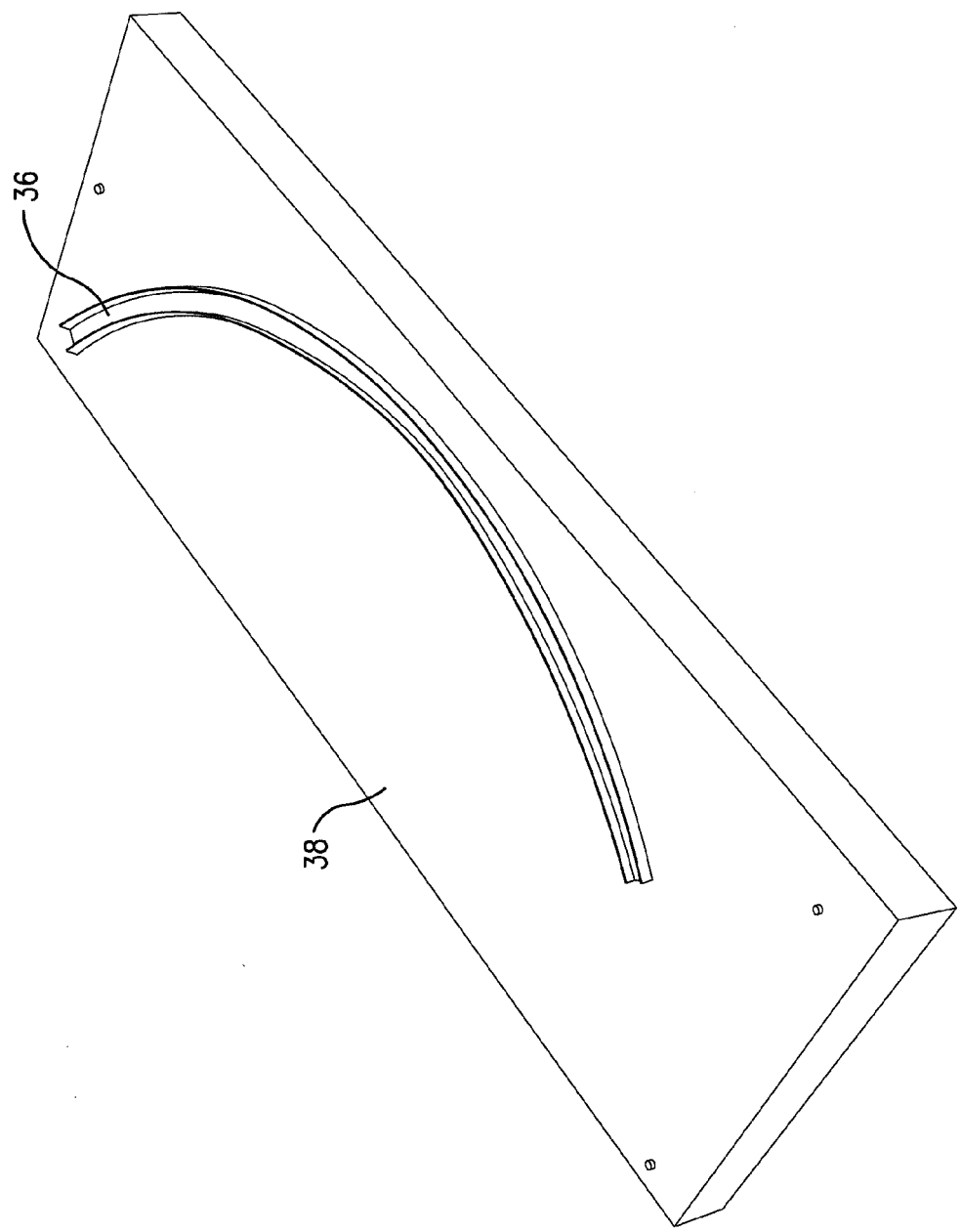
FIG. 3 illustrates a manufactured part in an unrestrained or relaxed state in which the part may be scanned and verified in accordance with embodiments of the present invention.
Figure 4:
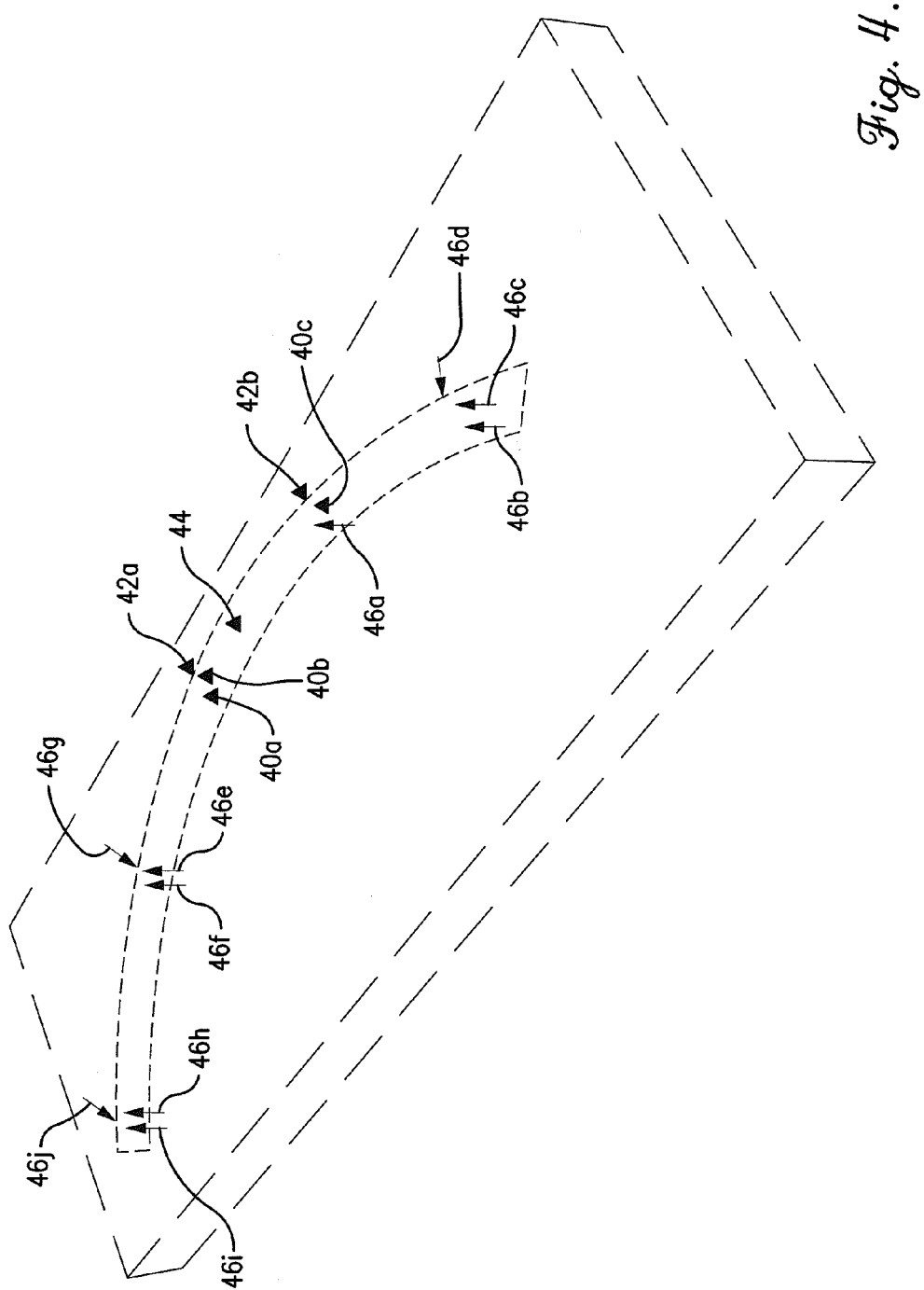
FIG. 4 illustrates the exemplary placement of virtual fixture points and load points in accordance with embodiments of the present invention.

An exemplary three-two-one alignment scheme is illustrated in FIG. 4 which may be used with a part similar to the part 36 illustrated in FIGS. 2 and 3. Three primary fixture points 40a-c define a plane, two secondary fixture points 42a, 42b define a line within the plane, and a tertiary fixture point 44 defines the final reference point.

The user also identifies a plurality of load points 46 that represent locations on the mesh, on the model or both where virtual loads are applied to adjust the shape of the model so that it conforms to the shape of the mesh. The number and location of the load points 46 may vary from one embodiment of the invention to another and from one part to another, and may be changed by the user during operation to optimize performance.

As explained above, the mesh corresponds to a particular part design and may be used to verify multiple instances of the corresponding manufactured part. The manufactured part 36 is scanned to generate a computer-based model of the part. In some embodiments, the computer-based model of the part is a three-dimensional point cloud that is a digital representation of the part 36 as measured. Such a point cloud may be created in a conventional manner and includes a plurality of points each corresponding to a point on the surface of the part 36. The number and density of the points depend on such factors as the size and shape of the part and will thus vary from one part to another. By way of example, there may be as few as a few hundred points or as many as thousands of points for a single part.

Scanning the part 36 involves collecting data indicative of the size and shape of the part 36 for use by a computer, and may be performed using any of various different systems or methods. By way of example, scanning may be performed using a laser scanner, coordinate measuring machine or similar device. It is typically advantageous to generate scan points corresponding as closely as possible to the fixture points 40, 42, 44 to facilitate alignment of the scan point cloud with the mesh. The particular method used to generate the computer-based model may vary without departing from the spirit or scope of the present invention.

Advantageously, the part 36 is scanned in an unrestrained or "free" state, such as at rest on a flat surface 38 as illustrated in FIG. 3. Because the manufactured part 36 will typically warp, twist or otherwise change shape during or after the manufacturing process, it will usually will not conform to the nominal part design 34. Thus, the verification process described herein uses an automated process to virtually constrain the computer-based model of the part 36 to verify the part 36.

The model is indexed (i.e., aligned) with the mesh by identifying points or locations in the model that correspond to the fixture points 40, 42, 44. If the fixture points 40, 42, 44 are chosen using the three-two-one alignment scheme discussed above, the plane defined by the first three fixture points 40 of the mesh is aligned with a corresponding plane in the model defined by three points corresponding to the three primary fixture points 40. Then the line defined by the fourth and fifth fixture points 42 is aligned with a corresponding line in the model defined by two points corresponding to the two secondary fixture points 42. The tertiary fixture point 44 is then aligned with a corresponding point in the model. Typically, the six fixture points 40, 42, 44 of the mesh can be mapped directly to corresponding points in the model. At this stage the fixture points 40, 42, 44 of the mesh will be aligned with corresponding points in the model, but the rest of the model may not be aligned with the corresponding points of the mesh.

Once the model is indexed to the mesh, the program adjusts the shape of the model to conform to the shape of the mesh by determining the virtual loads necessary to be placed on the model at the load points 46 to force model into the shape of the mesh. The particular method of adjusting the model is not essential to the present invention and may vary from one embodiment of the invention to another without departing from the spirit or scope of the invention. An iterative process is described in detail below, but it will be appreciated that other methods, such as a system of equations, may be used with equally effective results.

Figure 5:
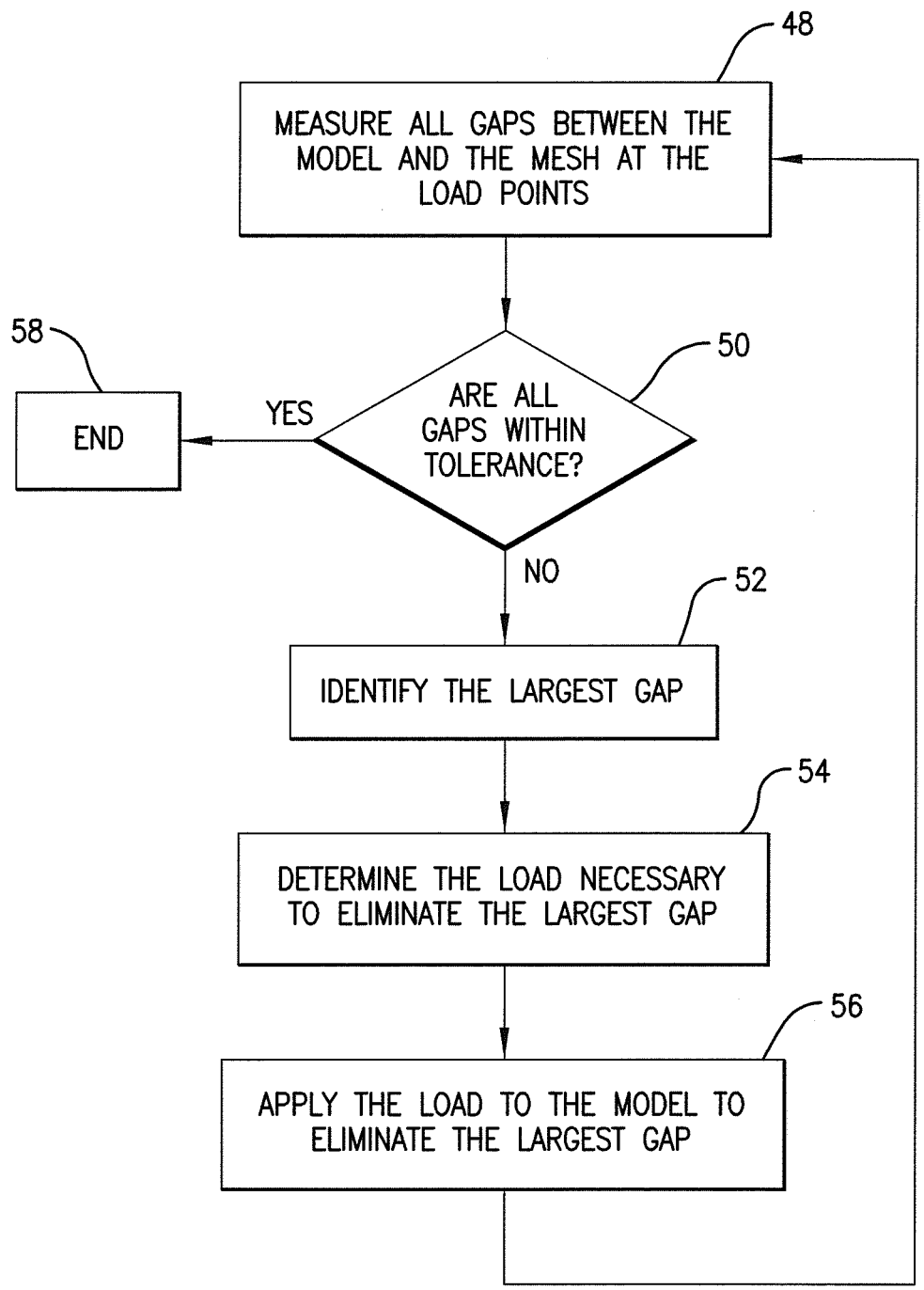
FIG. 5 is a flow diagram illustrating various steps involved in a process of adjusting a computer-based model of a scanned part in accordance with embodiments of the present invention.

With reference to FIG. 5, an exemplary method of adjusting the model involves measuring gaps between the model and the mesh at the load points 46, as depicted in block 48, and determining whether all of the gaps are within tolerance, as depicted in block 50. The gaps represent deviations between the shape of the model and the shape of the mesh, and the tolerance is the acceptable deviation. Thus, the tolerance will typically be a small value and may be determined and modified by the user. Most or all of the gaps will typically be outside of tolerance the first time they are measured.

If any of the gaps are not within tolerance, the program identifies the largest gap, as depicted in block 52, and then determines the load necessary to eliminate the largest gap, as depicted in block 54. In determining the load necessary to eliminate the largest gap, the program calculates a load vector including both the magnitude and the direction of the load necessary to apply at the load point corresponding to the largest gap to eliminate the gap or reduce it to tolerance. The direction of the load vector may be any direction in three-dimensional space.

When the program determines the load necessary to eliminate the gap, it applies the load to the model, as depicted in bock 56, to adjust the shape of the model and thereby eliminate the gap between the model and the mesh at that load point. More particularly, the program uses finite element analysis to determine the necessary load applied to the mesh to cause it to deform to eliminate the gap. The program also determines how the shape of the part changes in reaction to the load, and in particular, changes in the locations of the other load points.

When the program determines the load necessary to apply to the mesh to eliminate the gap and determines the reaction of the mesh to application of the load, it applies the load to the model to adjust the model to eliminate the gap, as depicted in block 56. More particularly, the program shifts the shape of the model in a manner that is the opposite of the adjustment the mesh would experience if the load were applied to the mesh. Thus, the model is shifted as if a load were applied to the model that would shift the model's shape to eliminate the largest gap. The model is shifted to close the gap by moving toward the mesh, rather than the mesh being adjusted to close the gap by moving toward the model.

Performing the load analysis on the mesh and then adjusting the shape of the model to reflect the shape changes in the mesh is necessary because the load analysis cannot be performed directly on the model. The model is simply a point cloud without additional data defining a relationship between the points, such that finite element analyses cannot be performed on the model itself. However, because the model will typically be very similar to the mesh in shape, the steps of performing load analyses on the mesh and using that data adjust the shape of the model yields accurate results.

When the model is adjusted to eliminate the largest gap, the program measures all of the gaps again to identify the largest gap, as depicted in block 48. The gap that was previously adjusted will be zero (or within tolerance) and the program will either determine that all gaps are within tolerance or it will identify another gap as the largest. The program then determines the load necessary to eliminate the largest gap and applies the load to the model, as explained above. The program repeats this process until it determines that all gaps are within tolerance, at which point it terminates the process, as depicted in block 58.

The program may repeat the steps set forth in FIG. 5 hundreds or even thousands of times before it determines the combination of loads that would adjust the model to correspond to the shape of the mesh. The application of each new load will typically affect the load points of previously-applied loads, such that previously closed gaps may be reopened and the load previously applied to close those gaps may need to be increased, decreased, and/or applied in a different direction. When the program determines that all gaps are within tolerance, it stores the most recent load information which corresponds to the actual loads required to adjust the shape of the actual part to conform to the part design. It also retains the final shape of the model for verification, wherein the adjusted model is compared with the mesh to confirm that the model's dimensions match the dimensions of the mesh.

The adjusted model represents the shape of the manufactured part 36 in a restrained position, as if the part were placed in a fixture. The program then determines the size of the adjusted part as well as the location of various part features, such as holes and trim, to confirm that the size, shape and overall configuration match the nominal part design. If one or more dimensions of the adjusted model do not conform to corresponding dimensions on the mesh, or if one or more features of the adjusted model do not correspond in size, shape and placement to corresponding features of the mesh, the part is defective.

In addition to confirming the size, shape and configuration of the part 36, the program also determines whether adjusting the shape of the part 36 would compromise the structure of the part 36 or otherwise render it unusable. If the part 36 is severely warped, for example, adjusting the shape of the part 36 to conform with the nominal design may induce plastic deformation in the part 36. The program can identify such problems during the adjustment process set forth above using principles of finite element analysis. By way of example, the program may calculate stress vectors associated with the application of the final loads placed on the model and, if any of the stress vectors exceeds a predetermined limit, alert a user that the part cannot be safely adjusted and, therefore, is defective.

Although the invention has been described with reference to the preferred embodiment illustrated in the attached drawing figures, it is noted that equivalents may be employed and substitutions made herein without departing from the scope of the invention as recited in the claims. By way of example, while the shape of the model is adjusted to conform to the shape of mesh in the example set forth above, the shape of the mesh may be adjusted to conform to the shape of the model.

Having thus described the preferred embodiment of the invention, what is claimed as new and desired to be protected by Letters Patent includes the following:

1. A method of verifying a part, the method comprising:
   scanning the part to create a three-dimensional computer-based model of the part;
   indexing the computer-based model of the part to a three-dimensional nominal part design by selecting a plurality of fixture points on the nominal part design and identifying a plurality of points on the model that correspond to the fixture points;
   adjusting the shape of the model to generate an adjusted model with a shape corresponding to the shape of the nominal part design, including simulating, on the model, the effect of applying one or more loads to the part in a manner that causes the shape of the model to change, wherein points on the model corresponding to the fixture points remain fixed relative to one another as the shape of the model changes;
   determining variations between the size and configuration of the adjusted model and the nominal part design; and
   using information collected while adjusting the shape of the model, determining whether adjusting the part to conform to the nominal part design would compromise the structural integrity of the part.

2. The method of claim 1, further comprising scanning the part in an unrestrained position to create the three-dimensional computer-based model of the part.

3. The method of claim 1, the step of determining a difference between the size and configuration of the adjusted model and the nominal part design further comprising the steps of—
   determining a difference between one or more dimensions of the adjusted model and corresponding dimensions of the design; and
   determining a difference between the position of one or more features of the adjusted model and corresponding features of the nominal part design.

4. The method of claim 1, the step of adjusting the shape of the model including using finite element analysis to change the shape of the model in a manner constrained by the physical characteristics of the part.

5. The method of claim 1, further comprising using finite element analysis to determine whether adjusting the part to conform to the nominal part design would compromise the structural integrity of the part.

6. The method of claim 5, further comprising generating stress vectors when adjusting the shape of the model and using the stress vectors to determine whether adjusting the part to conform to the nominal part design would compromise the structural integrity of the part.

7. The method of claim 1, the step of determining whether adjusting the part to conform to the nominal part design would compromise the structural integrity of the part involving determining whether adjusting a shape of the part from a warped or twisted state to an unwarped or untwisted state would cause plastic deformation in the part.

8. The method of claim 1, the step of create a three-dimensional computer-based model of the part including creating a three-dimensional point cloud representing surface points of the scanned part.

9. The method of claim 1, wherein simulating the effect of applying one or more loads to the model includes simulating the effect of applying at least two loads that cause the model to deform in at least two different directions.

10. The method of claim 1, the nominal part design including a three-dimensional mesh comprising a plurality of nodes and material property information defining relationships between the nodes.

11. A method of verifying a part, the method comprising:
scanning the part in an unrestrained position to create a point cloud comprising a plurality of points each representing a point on the surface of the part;
indexing the point cloud to a mesh based on a nominal part design;
adjusting the shape of the point cloud to generate an adjusted point cloud with a shape corresponding to the shape of the mesh, wherein adjusting the point cloud includes—
(a) selecting a plurality of different load points on the point cloud,
(b) determining a gap between the point cloud and the mesh at each of the load points,
(c) identifying the largest gap,
(d) adjusting the shape of the point cloud to simulate applying a load to the point cloud at the load point corresponding to the largest gap, the magnitude of the simulated load being sufficient to reduce the largest gap to within a tolerance, and
(e) repeating steps (b) through (d) until all of the gaps are within the tolerance,
determining variances between the size and configuration of the adjusted point cloud and the mesh; and
using information collected while adjusting the shape of the point cloud, determining whether adjusting the part to conform to the mesh would compromise the structural integrity of the part.

12. The method of claim 11, step (d) including using finite element analysis to change the shape of the point cloud in a manner constrained by the physical characteristics of the part.

13. The method of claim 11, wherein adjusting the shape of the point cloud includes adjusting only positions of the load points in response to the simulated load.

14. The method of claim 11, further comprising using finite element analysis to determine whether adjusting the part to conform to the mesh would compromise the structural integrity of the part.

15. The method of claim 11, the step of determining whether adjusting the part to conform to the mesh would compromise the structural integrity of the part involving determining whether adjusting a shape of the part from a warped or twisted state to an unwarped or untwisted state would cause plastic deformation in the part.

16. The method of claim 11, further comprising selecting a plurality of fixture points on the mesh, the step of indexing the point cloud to the mesh including identifying a plurality of points in the point cloud that correspond to the fixture points.

17. The method of claim 16, the step of adjusting the shape of the point cloud including simulating, on the point cloud, the effect of applying one or more loads to the part in a manner that causes the shape of the point cloud to change, wherein points on the point cloud corresponding to the fixture points remain fixed relative to one another as the shape of the point cloud changes.

18. A method of verifying a part, the method comprising:
scanning the part to create a three-dimensional computer-based model of the part;
indexing the computer-based model of the part to a three-dimensional nominal part design;
adjusting the shape of the nominal part design to generate an adjusted design with a shape corresponding to the shape of the computer-based model;
determining variations between the size and configuration of the adjusted design and the model; and
using information collected while adjusting the shape of the design, determining whether adjusting the part to conform to the nominal part design would compromise the structural integrity of the part.

* * * * *